United States Patent
Patterson

(10) Patent No.: US 7,143,418 B1
(45) Date of Patent: Nov. 28, 2006

(54) CORE TEMPLATE PACKAGE FOR CREATING RUN-TIME RECONFIGURABLE CORES

(75) Inventor: Cameron D. Patterson, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 711 days.

(21) Appl. No.: 10/013,764

(22) Filed: Dec. 10, 2001

(51) Int. Cl.
*G06F 9/00* (2006.01)

(52) U.S. Cl. .................. 719/328; 719/316; 719/332; 716/16; 703/24

(58) Field of Classification Search ............... 719/310, 719/316, 328, 331, 332; 718/104; 716/16, 716/17, 18; 703/23, 24, 27
See application file for complete search history.

(56) References Cited

U.S. PATENT DOCUMENTS

| | | | | |
|---|---|---|---|---|
| 6,053,947 | A * | 4/2000 | Parson | 703/14 |
| 6,199,195 | B1 * | 3/2001 | Goodwin et al. | 717/104 |
| 6,216,258 | B1 * | 4/2001 | Mohan et al. | 716/17 |
| 6,243,851 | B1 * | 6/2001 | Hwang et al. | 716/10 |
| 6,292,925 | B1 * | 9/2001 | Dellinger et al. | 716/8 |
| 6,421,808 | B1 * | 7/2002 | McGeer et al. | 716/1 |
| 6,430,732 | B1 * | 8/2002 | Hwang et al. | 716/11 |
| 6,539,438 | B1 * | 3/2003 | Ledzius et al. | 710/8 |
| 6,634,008 | B1 * | 10/2003 | Dole | 716/1 |
| 6,839,884 | B1 * | 1/2005 | Narain et al. | 716/5 |
| 2002/0174266 | A1 * | 11/2002 | Palem et al. | 709/328 |
| 2004/0073899 | A1 * | 4/2004 | Luk et al. | 717/158 |

OTHER PUBLICATIONS

Jonathan Ballagh, Java Debug hardware Models using JBits, 2001, pp. 1-8.*

Jonathan B. Ballagh, An FPGA-based Run-time Reconfigurable 2-D Discrete Wavelet Transform Core, Jun. 2001, pp. 1-83.*

Peter Bellows et al.; "JHDL—An HDL for Reconfigurable Systems"; IEEE Symposium on Field-Programmable Custom Computing Machines (FCCM'98); Apr. 1998; pp. 175-184.

Michael Chu et al.; "Object Oriented Circuit-Generators in Java"; IEEE Symposium on Field-Programmable Custom Computing Machines (FCCM'98); Apr. 1998; pp. 158-166.

Steve Guccione et al.; "JBits: Java Based Interface for Reconfigurable Computing"; Second Annual Military and Aerospace Applications of Programmable Devices and Technologies (MAPLD'99); Sep. 1999; pp. 1-9.

(Continued)

*Primary Examiner*—William Thomson
*Assistant Examiner*—Andy Ho
(74) *Attorney, Agent, or Firm*—LeRoy D. Maunu

(57) ABSTRACT

A method and apparatus for creating run-time reconfigurable cores using a core template package. The core template package provides an object-oriented application programming interface for specifying run-time reconfigurable (RTR) electronic circuit designs in a RTR application program. A run-time parameterizable (RTP) core library includes a plurality of predefined RTP core classes that implement selected functions in an electronic circuit design when invoked from an RTR application program. An RTP core template package includes a plurality of template classes. Each template class has a predefined set of method interfaces and fields. The RTP core template package further includes an RTP core template class that includes methods for building, connecting and traversing a hierarchy of RTP core objects based on the template classes and the predefined RTP core classes.

16 Claims, 3 Drawing Sheets

OTHER PUBLICATIONS

Eric Keller; "JRoute: A Run-Time Routing API for FPGA Hardware"; Seventh Reconfigurable Architectures Workshop (RAW 2000); May 1-5, 2000; Springer-Verlag, Berlin; pp. 874-881.

Delon Levi et al.; "BoardScope: A Debug Tool for Reconfigurable Systems"; Configurable Computing: Technology and Applications, Proceedings SPIE 3526; SPIE—The International Society for Optical Engineering; Nov. 1998; pp. 239-246.

Oskar Mencer et al.; "PAM-Blox: High Performance FPGA Design for Adaptive Computing"; IEEE Symposium on Field-Programmable Custom Computing Machines (FCCM'98); Apr. 1998; pp. 167-174.

Cameron Patterson; "High Performance DES Encryption in Virtex FPGAs using JBits"; IEEE Symposium on Field-Programmable Custom Computing Machines (FCCM 2000); Apr. 2000; pp. 113-121.

Cameron Patterson; "JBits Design Abstractions"; Proceedings of the 9th Annual IEEE Symposium on Field-Programmable Custom Computing Machines (FCCM'01); Copyright 2001 IEEE; pp. 1-2.

S. A. Guccione et al.; "Run-Time Parameterizable Cores"; Ninth International Workshop on Field-Programmable Logic and Applications (FPL'99); Springer-Verlag Lecture Notes in Computer Science, vol. 1673; Aug. 1999; pp. 215-222.

Sundararajarao Mohan et al.; "The Core Generator Framework"; Fifth Canadian Workshop on Field-Programmable Devices (FPD'98); Jun. 1998; pp. 1-6.

L. James Hwang et al.; "Generating Layouts for Self-Implementing Modules"; Eighth International Workshop on Field-Programmable Logic and Applications (FPL'98); Aug. 1998; pp. 525-529.

\* cited by examiner

US 7,143,418 B1

CORE TEMPLATE PACKAGE FOR CREATING RUN-TIME RECONFIGURABLE CORES

GOVERNMENT CONTRACT

The U.S. Government has a paid-up license in this invention and the right in limited circumstances to require the patent owner to license others on reasonable terms as provided for by the terms of DABT63-99-3-0004 awarded by DARPA.

FIELD OF THE INVENTION

The present invention generally relates to run-time reconfigurable computing, and more particularly to tools for creating run-time reconfigurable applications.

BACKGROUND

Field programmable gate arrays (FPGAs), first introduced by Xilinx in 1985, are becoming increasingly popular devices for use in electronics systems. For example, communications systems employ FPGAs in large measure for their re-programmability. In general, the use of FPGAs continues to grow at a rapid rate because they permit relatively short design cycles, reduce costs through logic consolidation, and offer flexibility in their re-programmability.

The field of reconfigurable computing is advancing steadily, using FPGAs as the basis for high-performance reconfigurable systems. Run-Time Reconfigurable (RTR) systems distinguish themselves by performing circuit logic and routing customization at run-time. RTR systems using FPGAs are expected to result in systems that require less hardware, less software, and fewer input/output resources than traditional FPGA-based systems. However, scarcity of software that supports RTR is believed to be one reason that RTR has been outpaced by research in other areas of reconfigurable computing.

Current tools for developing an RTR application are perceived as requiring a great deal of knowledge relative to the architecture of the hardware device to which the RTR application is targeted. For example, one tool provides methods for manipulating a configuration bitstream for programming various resources of a programmable logic device. Forcing a designer to think of a design at too low a level complicates matters for the designer.

A system and method that address the aforementioned problems, as well as other related problems, are therefore desirable.

SUMMARY OF THE INVENTION

In various embodiments, the invention provides a method and apparatus for creating run-time reconfigurable cores using a core template package. The core template package provides an object-oriented application programming interface for specifying run-time reconfigurable (RTR) electronic circuit designs in a RTR application program. A run-time parameterizable (RTP) core library includes a plurality of predefined RTP core classes that implement selected functions in an electronic circuit design when invoked from an RTR application program. An RTP core template package includes a plurality of template classes. Each template class has a predefined set of method interfaces and fields. The RTP core template package further includes an RTP core template class that includes methods for building, connecting and traversing a hierarchy of RTP core objects based on the template classes and the predefined RTP core classes.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

Various embodiments of the present invention are described in terms of Java-based abstract classes and the JBits environment from Xilinx. Those skilled in the art will appreciate that the invention could be implemented in other programming languages, applied to programmable logic devices (PLDs) other than FPGAs, and/or adapted to a variety of applications.

The invention insulates a hardware designer from the details of the lower-level modules that are used to generate a configuration bitstream, while providing a hierarchical, class-based interface for developing a hardware design. In one embodiment, the high-level interface is an object-oriented programming language, such as Java. For an application involving both hardware and software components, the invention presents the opportunity to develop both components in the programming language. This presents benefits in terms of managing the development process and sharing code.

Figure 1:
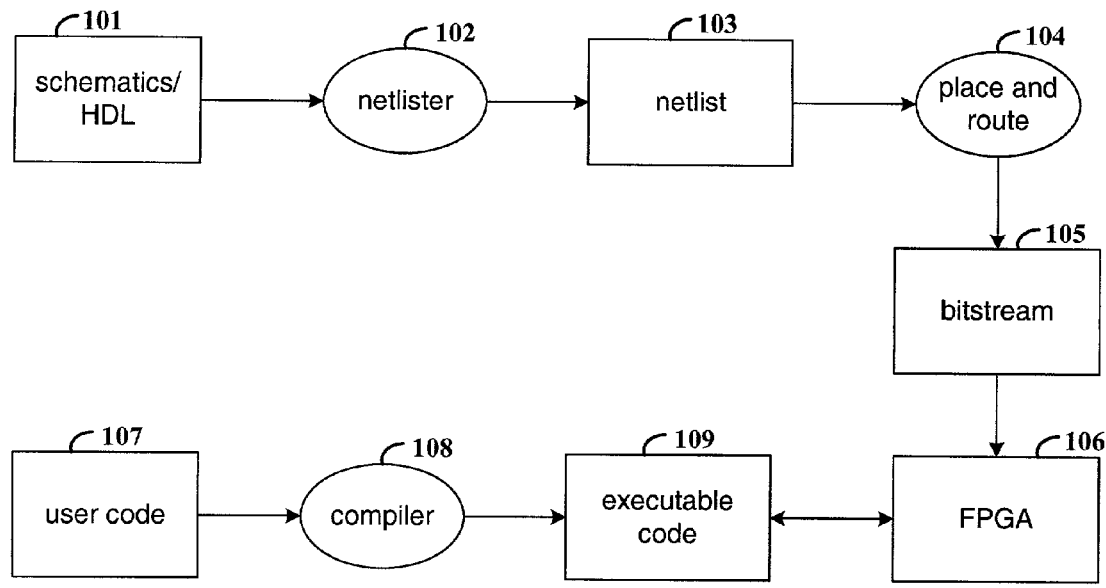
FIG. 1 illustrates an example design flow of a circuit implemented in an FPGA using a reconfigurable logic coprocessor.

Design of a circuit implemented in an FPGA using a reconfigurable logic coprocessor in some environments requires a combination of two distinct design paths, as shown in FIG. 1. The first and perhaps most significant portion of the effort involves circuit design using traditional CAD tools. The design path for these CAD tools typically comprises entering a design 101 using a schematic editor or hardware description language (HDL), using a netlister 102 to generate a netlist 103 for the design, importing this netlist into an FPGA placement and routing tool 104, which finally generates a bitstream file 105 of configuration data used to configure the FPGA 106.

Once the configuration data has been produced, the next task is to provide software to interface the processor to the FPGA. The user enters user code 107, which is then compiled using compiler 108 to produce executable code 109. The instructions in executable code 109 are then used by the processor to communicate with the configured FPGA 106. It is also known to use executable code 109 to control the configuration of FPGA 106 with bitstream file 105. This series of tasks is usually completely decoupled from the task of designing the circuit and hence can be difficult and error-prone.

In addition to the problems of interfacing the hardware and software in this environment, there is also the problem of design cycle time. Any change to the circuit design requires a complete pass through the hardware design tool chain (101–106 in FIG. 1). This process is time consuming, with the place and route portion of the chain typically taking several hours to complete.

Finally, this approach provides no support for runtime reconfiguration. The traditional hardware design tools provide support almost exclusively for static design. It is difficult to imagine constructs to support runtime reconfiguration in environments based on schematic or HDL design entry.

Figure 2:
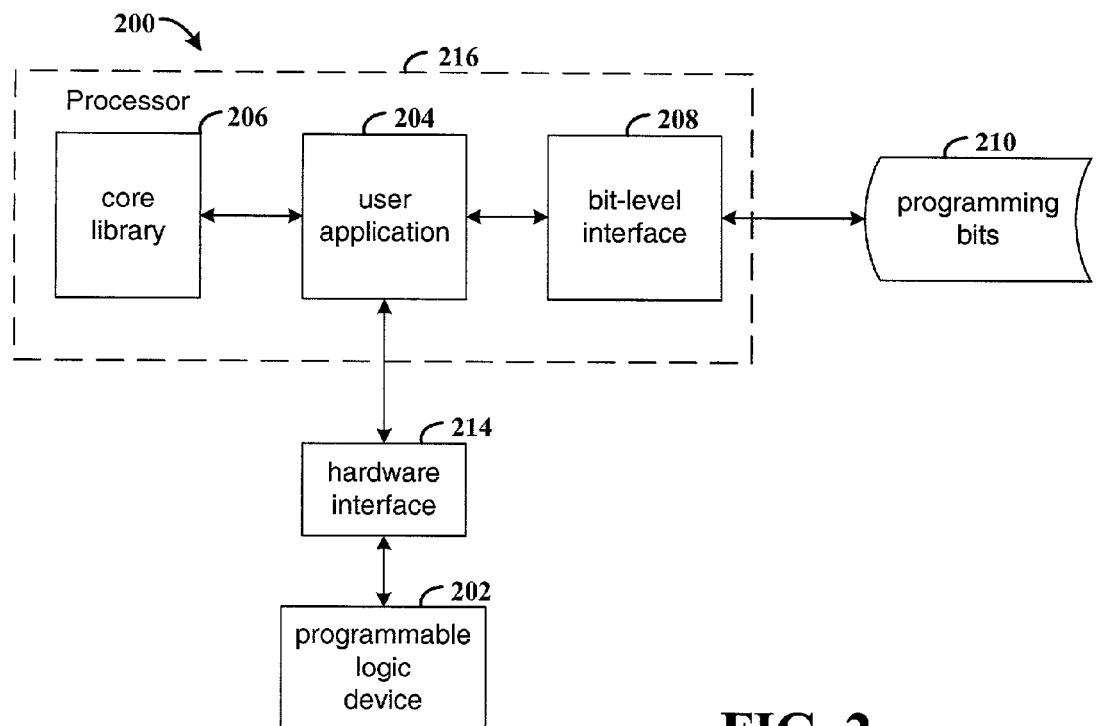
FIG. 2 is a block diagram of a system for configuration of a programmable logic device in an run-time reconfigurable (RTR) system.

FIG. 2 is a block diagram of a system 200 for configuration of a programmable logic device 202 in an RTR system. System 200 includes a user application program 204 that is written in the Java® language, for example. The application program 204 may be written to perform various functions relative to the environment in which system 200 is used. For example, in addition to configuration and/or run-time reconfiguration of programmable logic device 202, the user application program 204 may be programmed to provide user-interface functions and/or digital signal processing.

Core library 206 is a collection of macrocell or "core" generators that are implemented as Java classes. The cores are generally run-time parameterizable (RTP) and relocatable within a device. Examples of cores include counters, adders, multipliers, constant adders, constant multipliers, flip-flops and other standard logic and computation functions.

Bit-level interface 208 includes an application program interface that allows the user application program 204 to manipulate configurable resources of programmable logic device 202. The bit-level interface also includes a set of functions, one or more of which are invoked when the user application program 204 references the application program interface. The set of functions in the bit-level interface manipulate selected ones of programming bits 210, based on the type of programmable logic device. For example, some of the functions in the set may be programmed for certain devices in the XC4000 family of FPGAs from Xilinx, Inc., and others of the functions may programmed for other devices in the Virtex™ FPGA family. Bit-level interface software is generally understood by those skilled in the art. For example, bit-level interface software has been provided with the JBits software from Xilinx.

The programming bits are stored in a storage element (not shown). For example, suitable storage media include magnetic, optical, electronic, or various combinations thereof that are readable and writable.

While core library 206, user application 204, and bit-level interface 208 are written in Java in the example embodiment, it will be appreciated that many other languages would also be suitable.

Hardware interface 214 includes a portable layer of software and accompanying hardware to couple application program 204 to programmable logic device 202. For example, hardware interface 214 may be the Xilinx Hardware Interface (XHWIF) which is available from Xilinx.

Processor 216 is coupled to programmable logic device 202 via hardware interface 214. The functional requirements of system 200 dictate the particular style and capabilities of processor 216. For example, some applications may call for a RISC based processor while others may call for a CISC. Various ones of special purpose or general purpose processors from manufacturers such as Intel, Sun Microsystems, Motorola, IBM, AMD and others may be suitable.

Figure 3:
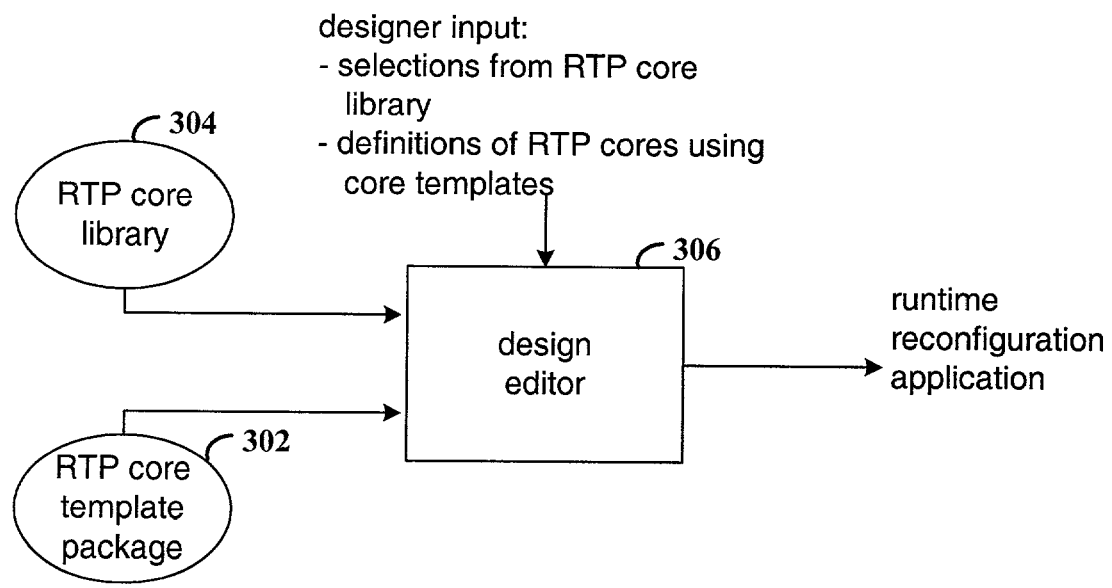
FIG. 3 is a functional block diagram that illustrates the use of a run-time parameterizable (RTP) core template package in combination with an RTP core library in creating an RTR application.

FIG. 3 is a functional block diagram that illustrates the use of an RTP core template package 302 in combination with an RTP core library 304 in creating an RTR application. A designer uses design editor 306 to create a runtime reconfiguration application by combining selected elements from RTP core library 304 and creating new cores using the RTP core template package 302. It will be appreciated that in an example embodiment, at least some of the elements in the RTP core library are created using the RTP core template package 302.

The RTP core template package provides standard design abstractions such as hierarchical modules with ports connected by nets and buses. The package suits both static core implementation and run-time core reconfiguration. There is also support for multiple core outputs formats, for example, a bitstream, netlist, and graphical views of the core structure.

The core template package also supports different granularities, for example CLB, slice and logic element (i.e. half-slice), and other configurable elements. In addition, the core template packages supports relative and absolute placement offsets, non-numeric placement relations, sourceless and inverting nets, IP protection, and subcore re-implementation. These capabilities are provided without a dichotomy between a hierarchical logical view, for example, as in the static design flow using hardware description languages, and a flat physical view of the design. For example, an object of the port class is initially a purely logical object to support a hierarchical design. A port object acquires physical significance by assigning one or more pin values. Flattening the design is not required, since packing and placement occurs hierarchically. The net class provides the router with a physical view of the connections. Low level implementation errors (such as a ConfigurationException or RouteException) are abstracted with a CoreException, which gives the error context in terms of the logical design hierarchy.

The core template package also provides an API for designing cores using, for example, the JBits System Developers Kit from Xilinx. JBits allows direct manipulation of an FPGA configuration bitstream, and provides low-level control over physical resources such as LUTs, multiplexers and interconnects. However, most designers prefer to work at a higher level of abstraction. To this end, the CoreTemplate package provides support for defining a hierarchy of modules with ports that are connected by nets and buses. This permits low-level JBits calls to be encapsulated in leaf-level modules or a library of primitives.

Figure 4:
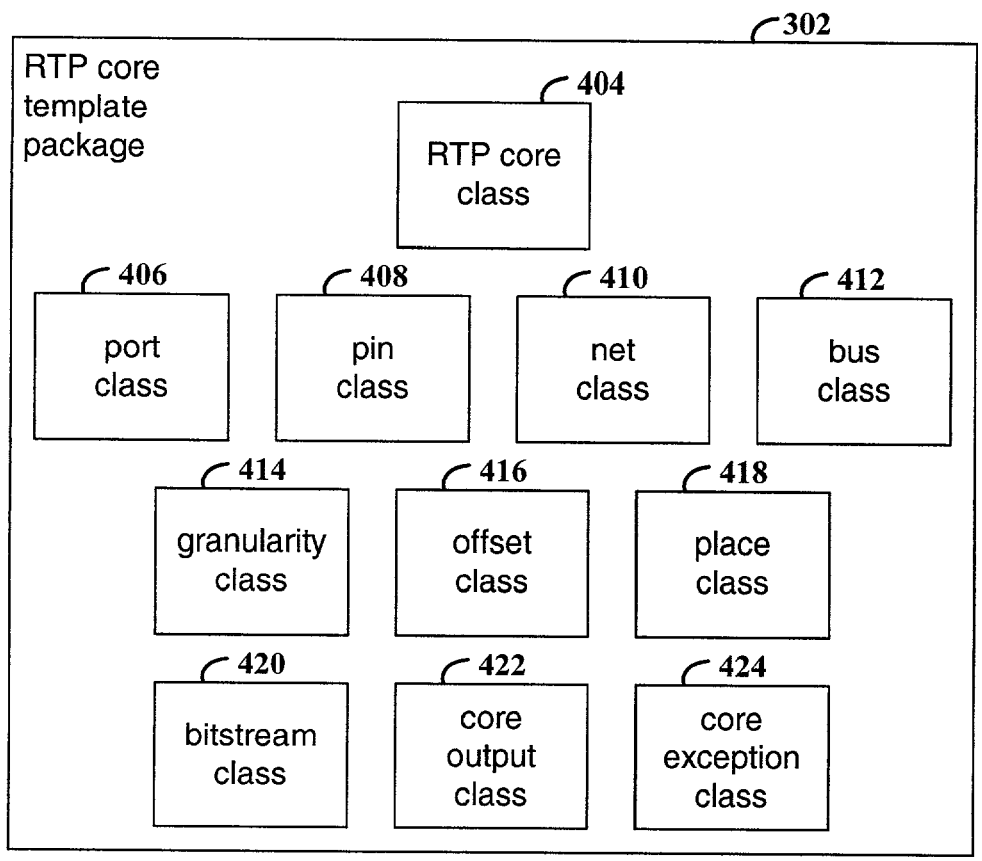
FIG. 4 is a block diagram that illustrates the classes in the RTP core template package in accordance with one embodiment of the invention.

FIG. 4 is a block diagram that illustrates the classes in the RTP core template package 302 in accordance with one embodiment of the invention. The classes include the RTP core class 404, port class 406, pin class 408, net class 410, bus class 412, granularity class 414, offset class 416, place class 418, bitstream class 420, core output class 422, and core exception class 424.

RTP core class 404 is an abstract class defining methods and fields for all levels in a hierarchical design. All cores are required to have an instance name that is passed to a superclass constructor. The subcores of a core should have distinct instance names. The constructors of the RTP core class define the core's ports, height, width, height granularity and width granularity. An implements method calls addChild( ) and defines internal signals. The addChild( ) method creates a parent child relationship between the RTP core object and another object. A parent core assigns the relative offsets of its subcores with respect to the parent's origin, and the application assigns an offset to the top-level core.

The RTP core class serves as a template for dynamically parameterizable and relocatable cores. This core is implemented as an abstract Java class, and is not useful by itself. It is only used as a template to create library core objects. Adhering to the format of this core template will ensure that core objects are consistent, work together, and will be supported in future releases.

The creation of an RTP core object proceeds as follows. The constructor defines the core's external characteristics, which are the ports, the height and width granularity, and the height and width. Constructors must invoke the methods setHeightGran(calcHeightGran( )), setWidthGran(calcWidthGran( )), setHeight(calcHeight( )) and setWidth(calcWidth( )). The calcHeightGran( ), calcWidthGran( ), calcHeight( ) and calcWidth( ) ("calc") methods should be static. Parameters that determine the core's granularity attributes and dimensions should be passed to the constructor and to the corresponding calc methods. A core having a fixed granularity or size will not have any arguments passed to the corresponding calc methods. Parameters that cannot be processed until the core is implemented (e.g. LUT contents) are passed to the implements method. Optional ports can be defined after the constructor is called, but this must be completed before the implement( ) method is called.

The setHeightGran( ) method sets the height granularity of the object, and the setWidthGran( ) method sets the width granularity. The setHeight( ) method defines the height of the core object using the value returned from calcHeight( ) method, and the setwidth( ) method defines the width of the core object using the value returned from calcWidth ( ).

The implement( ) method instantiates a subcore in three steps. First, the subcore's constructor is called. Next, addChild(subcore) is called, and the subcore's relative offset is defined, or addChild(subcore, Place) is called which also assigns the offset. Finally, subcore.implement( ) is called. Thus, there is only a single pass over the hierarchy, and it is the same pass that builds the hierarchy. Core construction occurs top-down, and core implementation proceeds bottom-up.

The connect( ) method in bitstream class 420 invokes the router to implement a net or bus signal, and should be called only once for the net or bus. This should be done at the highest level in the hierarchy where the net or bus is defined, and only after the net or bus is physically defined (i.e. all of the net or bus pins are assigned through all levels of the hierarchy). Otherwise, a RouteException occurs. Subcores connected to the net or bus must be placed and implemented before calling Bitstream.connect( ), because routing is not deferred.

An object of the port class (a "port") 406 equates a signal (net or bus) that is external to a core with a signal that is internal to the core. Ports have a direction and width, where the port width is inferred by the width of the external signal, the width of the internal signal, or the number of internal pins. A WidthMismatchException is thrown if these width indicators disagree.

Ports are associated with an RTP core. Initially, the port is a logical object with a name, direction and a width of 0. The ports of a core should have unique names, although this is not enforced. A port acquires physical significance by assigning pin sets to the port, where the number of pin sets should match the width of the port.

If both the internal and external signals are non-null, then these two signals must have the same width or else a WidthMismatchException is thrown. Note that a port can connect a net with a bus of width 1. If both the internal signal and external signal are null, then the port is not being used and may be ignored.

The connect( ) method in bitstream class 420 will throw an exception if a port's internal signal is null and the external signal is non-null and the port has no pins, or the internal signal is non-null and the external signal is null. In these situations, it is unknown whether the disconnect is intentional or unintentional. Net.NoConnect can be used to explicitly designate that a signal of a port is to be left unconnected.

An object of the pin class (a "pin") 408 associates one or more physical resources with a port. Primitive cores define internal pins for their ports, rather than internal signals. An example of a pin is a LUT input.

An object of the net class (a "net") 410 is a named set of source and sink ports within the scope of a single RTPCore. The implementation is time and space optimized for common cases such as single driver and single fanout nets. Nets may have an inversion ("bubble") attribute.

An object of the bus class (a "bus") 412 is an indexed multiset of nets that are within the scope of a single RTP core object.

An object of the granularity class 414 identifies the horizontal or vertical granularity of a coordinate. Supported granularities include, for example, CLB, slice and logic element (i.e. the top or bottom half of a slice). This allows fine-grained cores to be defined and placed without wasting CLB resources.

Different granularities are provided because a single granularity is not suitable for all cores. Granularity is similar to data alignment requirements in a microprocessor architecture. CLB granularity is comparable to aligning on a word boundary, slice granularity corresponds to half word alignment (e.g., in Virtex FPGAs), and logic element granularity is akin to byte alignment.

An object of the offset class 416 identifies the relative or absolute position of cores that use CLB resources, and represents the horizontal and vertical coordinates of the lower left corner of the core's bounding box. Offsets are in terms of CLB coordinates, optional slice coordinate within the CLB, and an optional logic element (i.e. LUT/FF pair) coordinate within the slice.

Horizontal and vertical offsets are initially undefined, and both must be set. When all horizontal offsets are undefined, calling setHorOffset( ) for one of the granularities sets the horizontal offsets for the other granularities to 0. When all vertical offsets are undefined, calling setVerOffset( ) for one of the granularities sets the vertical offsets for the other granularities to 0.

If either of the operands of an addition or subtraction are undefined, the result will be undefined. The client does not have to ensure that a slice or logic element coordinate is in range after a set, add or subtract operation, because normalization is automatic.

Modifying a vertical logic element offset progresses to the next slice within the current carry chain. Getting or setting a horizontal logic element offset or vertical slice offset will produce an UndefinedGranException.

An object of the place class 418 provides an optional alternative to calculating offsets, and applies user-defined position relations to the sequence of subcores (e.g. addChild (subcore, Place.ABOVE_PREV_ALIGN_LEFT)). Cores with different granularities may be freely mixed. Without this class, an RTP core must compute and assign horizontal and vertical offsets to each subcore. This code is tedious, opaque and error-prone, especially when subcores have different granularities. The place class abstracts this away by applying user-defined position relations to the sequence of subcores (e.g. addChild(subcore, Place.ABOVE_PREV_ALIGN_LEFT)). Most of the floorplans used in structured datapaths can be succinctly and completely specified in this way. This class requires that RTPCore constructors define the height and width of the core.

The position of the first child core can be in the LOWER_LEFT, UPPER_LEFT, LOWER_RIGHT or UPPER_RIGHT corner of the parent core's bounding box. The position of a subsequent child core and its horizontal or vertical alignment is with respect to the position of the previous child core, or the collection of all previous child cores. For example, the first child core could be placed in the LOWER_LEFT, and subsequent child cores could be placed ABOVE_PREV_ALIGN_LEFT. This creates a column of child cores that grows upwards and is aligned on the left side. In order to fold the column to the right in a zigzag arrangement, a core could be added RIGHTOF_ALL_PREV_ALIGN_TOP. A non-zigzagged folding would be accomplished by adding a core with the directive RIGHTOF_ALL_PREV_ALIGN_BOTTOM.

An object of the bitstream class 420 encapsulates all calls to the JBits and JRoute APIs. This insulates the core from maintaining JBits and JRoute references, and from administering concurrent netlist file generation.

An object of the core output class 422 defines what is to be produced by the top-level RTP core object, for example a bitstream or netlist files. More than one output may be produced at the same time.

An object of the core exception class 424 encapsulates any exception thrown inside an RTP core object, which avoids the need for passing every type of exception up through the calling chain. The original exception is recorded and may be queried.

Figure 5:
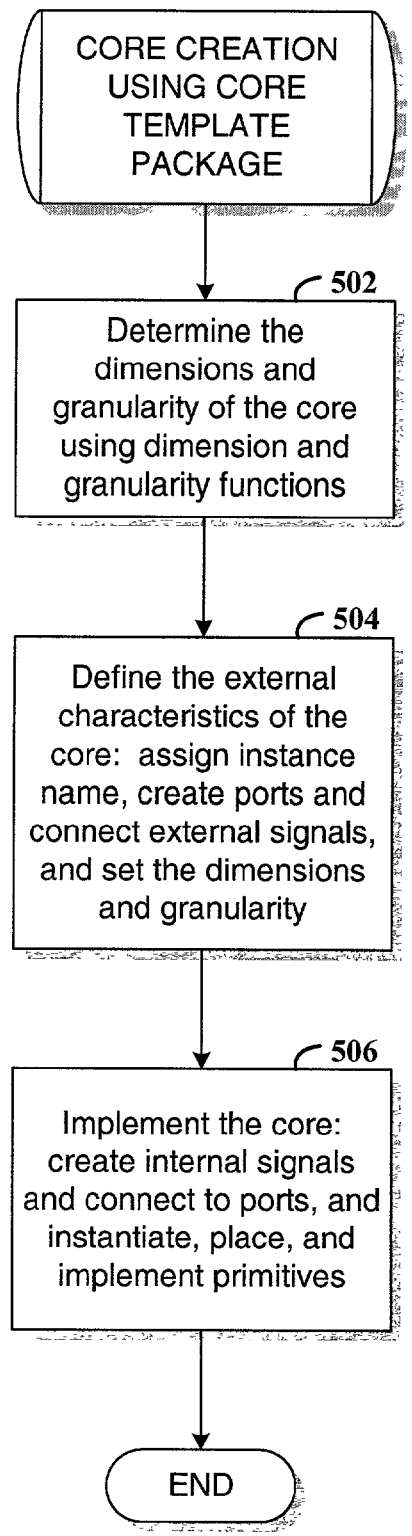
FIG. 5 is a flowchart of an example process for creating an RTP core object using the core template package.

FIG. 5 is a flowchart of an example process for creating an RTP core object using the core template package, in accordance with one embodiment of the invention. At this point in the discussion it will be helpful to distinguish between "primitive" RTP cores and "non-primitive" RTP cores. A primitive RTP core is a core that does not contain subcores. A primitive RTP core uses JBits calls to implement its functionality. A non-primitive RTP cores is a core that contains subcores. Non-primitive cores typically implement themselves by instantiating primitive and/or non-primitive subcores connected with nets and buses. A top-level RTP-Core is a core that does not have a parent, and its relative offset is with respect to the device. The following paragraphs describe three general stages of the process to create an RTP core using the core template package.

In a first stage (block 502), the granularity and dimensions of the core are calculated. Every core should define the following four static methods:
    public static int calcHeight(PARAMETERS)
    public static int calcWidth(PARAMETERS)
    public static int calcHeightGran(PARAMETERS)
    public static int calcWidthGran(PARAMETERS)

Static methods allow the dimensions and granularity to be determined without first instantiating a core. This facilitates interactive core specialization. Any core parameters that affect the dimensions or granularity should be passed to the calc methods. By doing so, parameters that affect the core's footprint are clearly identified. Cores with fixed size and/or granularity will not have calc method parameters.

Calculating a core's granularity is explained by way of the following example in which a register is defined with fixed CLB granularities.

```
/**
 * Compute and return the vertical granularity of
 a Register core.
 */
public static int calcHeightGran( ) {
    return Gran.CLB;
}
/**
 * Compute and return the horizontal granularity of a
 Register core.
 */
public static int calcWidthGran( ) {
    return Gran.CLB;
}
```

In calculating the dimensions of the core, it is assumed that the Register core has a fixed width of 1, where the units are given by the width granularity (i.e. CLB). The height of the core (in CLB units) is equal to the width of the data bus divided by 4.

```
/**
 * Compute and return the height of a Register
 core.
 *
 * @param busWidth the width of the data input
 and output ports
 */
public static int calcHeight(int busWidth) {
    return (busWidth / 4);
}
/**
 * Compute and return the width of a Register core.
 */
public static int calcWidth( ) {
    return 1;
}
```

The second stage of designing a core using the core template package is to define the external characteristics of the core (block 504). By convention, an RTP core constructor defines the core's ports, height, width, height granularity and width granularity. Any core parameters which affect the dimensions or granularity should be passed to the constructor. External signals connected to the ports are also generally passed as parameters. If this results in a large number of constructor arguments, then ports may be defined after the constructor is called but before calling the implement( ) method. Alternatively, a CoreParameters object may be used to encapsulate the parameters.

```
/** Create an instance of a Register core.
 *
 @param name the name assigned to this Register
 instance
 @param busWidth the width of the register, which must
 be a multiple of 4
 @param clk the external net to be connected to the
 CLK port
 @param din the external bus to be connected to the
 DIN port
 @param dout the external bus to be connected to the
 DOUT port
 @exception CoreException if busWidth is not a
```

```
                            -continued
    multiple of 4
    */
    public Register(String instanceName, int busWidth,
        Net clk, Bus din, Bus dout) throws CoreException {
```

Setting the external characteristics include assigning an instance name to the core, checking and storing parameters, setting the dimensions and granularity, and creating ports and connecting external signals. Assigning an instance name to the core is done with an explicit call to the superclass constructor. For example:

super(instanceName);

Checking and storing parameters is performed with the private checkParameters methods. For example:

```
    try {
        checkParameters(busWidth);
    } catch (CoreParameterException cpe) {
        throw new CoreException(cpe);
    }
    this.busWidth = busWidth;
```

Setting the dimensions and granularity of a core is performed by calling the calc methods:

setHeightGran(calcHeightGran( ));
setWidthGran(calcWidthGran( ));
setHeight(calcHeight(busWidth));
setWidth(calcWidth( ));

The generic calc methods will compute the dimensions of any Register instance, while the set methods fix the dimensions of a particular Register instance.

Creating ports and connecting external signals to the ports is performed by defining a field for each port. Internal nets or pins are connected to the port by the implement( ) method. Fields are generally not needed for internal and external signals, since the ports already maintain references to these signals. For example:

clkPort=newInputPort("CLK", clk);
dinPort=newInputPort("DIN", din);
doutPort=newOutputPort("DOUT", dout);

The third stage of defining a core using the core template package is implementing the core (block 506). A core C may be implemented only after it has been placed by the core or an application that called C's constructor. C is placed either with placement relations from the place class, or by assigning to C's relative offset. Finally, the implement( ) method is called. For example:

```
    /**
     * Implement this Register instance.
     *
     * @exception CoreException if anything goes awry
     */
    public final void implement( ) throws CoreException {
```

The implement( ) method creates internal signals and connects the signals to ports, and then instantiates and places the primitives. When creating internal signals and making port connections, each port of a non-primitive core defines an internal signal that must match the width of the external signal. For example:

Net clk=newNet("clk");
Bus din=newBus("din", busWidth);
Bus dout=newBus("dout", busWidth);
clkPort.setIntSig(clk);
dinPort.setIntSig(din);
doutPort.setIntSig(dout);

Continuing with the Register example, the next stage of the implement( ) method instantiates an "FD" primitive for each bit in the data bus. The FD primitives are connected to the internal signals and added as subcores of the Register. Using placement directives, the FDs are packed into a vertical column of CLBs. Finally, each FD is implemented, as illustrated in the example code below:

```
    for (int i = 0; i < busWidth; i++) {
        FD fd = new FD("fd" + i, FD.FD, clk,
                din.getNet(i), dout.getNet(i));
        if (i == 0)
            addChild(fd, Place.LOWER_LEFT);
        else if ((i % 2) == 0)
            addChild(fd,
                Place.ABOVE_ALL_PREV_ALIGN_LEFT);
        else
            addChild(fd,
                Place.RIGHTOF_PREV_ALIGN_BOTTOM);
        fd.implement( );
    }
```

The present invention is believed to be applicable to a variety of systems for run-time reconfiguration of PLDs and has been found to be particularly applicable and beneficial with respect to FPGAs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An object-oriented application programming interface for specifying, in a RTR application program, run-time reconfigurable (RTR) electronic circuit designs for programmable logic devices (PLDs), comprising:

a run-time parameterizable (RTP) core library including a plurality of predefined RTP core classes that implement selected functions in an electronic circuit design when invoked from an RTR application program; and an RTP core template package including a plurality of template classes, each template class having a predefined set of method interfaces and fields, the RTP core template package further including an RTP core template class that includes methods for building, connecting and traversing a hierarchy of RTP core objects based on the template classes and the predefined RTP core classes, wherein the RTP core template package includes a template class having a plurality of methods for placement of an RTP core object on a first set of resources of a PLD relative to placement of another RTP core object on a second set of resources of the PLD.

2. The application programming interface of claim 1, wherein the RTP core template class includes methods for instantiating RTP sub-core objects.

3. The application programming interface of claim 2, wherein the RTP core template class includes methods for defining external interface characteristics of an RTP core object.

4. The application programming interface of claim 2, wherein the RTP core template package includes a class with methods for generating output in bitstream and netlist formats.

5. The application programming interface of claim 2, wherein the RTP core template package includes a template class having a plurality of fields for specifying placement of an RTP core object relative to a selected level of programmable resources in a hierarchy of programmable resources.

6. The application programming interface of claim 5, wherein the programmable resources are associated with a field programmable logic device (FPGA).

7. The application programming interface of claim 2, wherein the RTP core template package includes a template class having a plurality of methods for specifying source ports and sink ports in an RTP core object.

8. The application programming interface of claim 1, wherein the RTP core template class includes methods for defining external interface characteristics of an RTP core object.

9. The application programming interface of claim 1, wherein the core template package includes a class with methods for generating output in bitstream and netlist formats.

10. The application programming interface of claim 1, wherein the RTP core template package includes a template class having a plurality of fields for specifying placement of an RTP core object relative to a selected level of programmable resources in a hierarchy of programmable resources.

11. The application programming interface of claim 10, wherein the programmable resources are associated with a field programmable logic device (FPGA).

12. The application programming interface of claim 1, wherein the RTP core template package includes a template class having a plurality of methods for specifying source ports and sink ports in an RTP core object.

13. A computer-implemented method for creating a run-time reconfigurable logic core for a programmable logic device (PLD) using a core template package having template class definitions, comprising:
    determining dimensions of the core relative to programmable resources of the PLD responsive to methods from the template package invoked in a core object;
    determining granularity of the core relative to programmable resources of the PLD responsive methods from the template package invoked in the core object;
    defining external characteristics of the core object, including an instance name, input and output ports, corresponding external signal names, core dimensions and core granularity responsive to methods from the template package invoked in the core object;
    connecting internal signals to ports responsive to methods from the template package invoked in the core object;
    instantiating sub-core objects responsive to methods from the template package invoked in the core object; and
    placing the sub-core objects responsive to methods from the template package invoked in the core object.

14. The method of claim 13, further comprising generating output in bitstream and netlist formats responsive to methods from the template package invoked in the core object.

15. The method of claim 13, wherein the core template package includes a template class having a plurality of fields for specifying placement of an RTP core object relative to a selected level of programmable resources in a hierarchy of programmable resources, and further comprising placing the sub-core objects responsive to values of the fields.

16. An apparatus for creating a run-time reconfigurable logic core for a programmable logic device (PLD) using a core template package having template class definitions, comprising:
    means for determining dimensions of the core relative to programmable resources of the PLD responsive to methods from the template package invoked in a core object;
    means for determining granularity of the core relative to programmable resources of the PLD responsive methods from the template package invoked in the core object;
    means for defining external characteristics of the core object, including an instance name, input and output ports, corresponding external signal names, core dimensions and core granularity responsive to methods from the template package invoked in the core object;
    means for connecting internal signals to ports responsive to methods from the template package invoked in the core object;
    means for instantiating sub-core objects responsive to methods from the template package invoked in the core object; and
    means for placing the sub-core objects responsive to methods from the template package invoked in the core object.

* * * * *